United States Patent
Kennedy et al.

(10) Patent No.: US 9,103,442 B2
(45) Date of Patent: Aug. 11, 2015

(54) SLIDING ELEMENT, IN PARTICULAR A PISTON RING, HAVING A COATING

(75) Inventors: Marcus Kennedy, Düsseldorf (DE); Michael Zinnabold, Burscheid (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 139 days.

(21) Appl. No.: 13/990,236

(22) PCT Filed: Nov. 24, 2011

(86) PCT No.: PCT/EP2011/070921
§ 371 (c)(1),
(2), (4) Date: Aug. 13, 2013

(87) PCT Pub. No.: WO2012/072483
PCT Pub. Date: Jun. 7, 2012

(65) Prior Publication Data
US 2013/0316156 A1 Nov. 28, 2013

(30) Foreign Application Priority Data
Nov. 29, 2010 (DE) .................. 10 2010 062 114

(51) Int. Cl.
| | |
|---|---|
| C23C 16/26 | (2006.01) |
| F16J 9/26 | (2006.01) |
| C23C 14/06 | (2006.01) |
| C23C 28/00 | (2006.01) |

(52) U.S. Cl.
CPC .............. *F16J 9/26* (2013.01); *C23C 14/0605* (2013.01); *C23C 16/26* (2013.01); *C23C 28/30* (2013.01); *C23C 28/343* (2013.01); *Y10T 428/2495* (2015.01); *Y10T 428/264* (2015.01); *Y10T 428/265* (2015.01); *Y10T 428/30* (2015.01)

(58) Field of Classification Search
USPC .................. 277/442; 428/336, 446, 447, 408
See application file for complete search history.

(56) References Cited

U.S. PATENT DOCUMENTS

| | | | | |
|---|---|---|---|---|
| 5,249,554 | A | * 10/1993 | Tamor et al. .................. | 428/446 |
| 6,354,008 | B1 | * 3/2002 | Domoto et al. ............. | 30/346.53 |
| 6,974,642 | B2 | * 12/2005 | Hyodo et al. .............. | 428/835.4 |
| 7,160,616 | B2 | * 1/2007 | Massler et al. ................ | 428/408 |
| 7,169,473 | B2 | * 1/2007 | Murakami et al. ............ | 428/408 |

(Continued)

FOREIGN PATENT DOCUMENTS

| | | |
|---|---|---|
| CN | 101705471 A | 5/2010 |
| DE | 19735962 A1 | 3/1998 |

(Continued)

OTHER PUBLICATIONS

"Plasma-deposited a-C(N):H films" by D.F. Franceschini, Brazilian Journal of Physics, vol. 30, No. 3, Sao Paulo 2000.

(Continued)

*Primary Examiner* — Archene Turner
(74) *Attorney, Agent, or Firm* — Robert L. Stearns; Dickinson Wright, PLLC

(57) ABSTRACT

The invention relates to a sliding element, such as a piston ring, comprising a coating on at least one surface comprising, form inside to outside, a bonding layer, a metal DLC layer preferably containing tungsten, and a metal-free DLC layer doped with nitrogen at least in some regions, wherein said sliding element is characterized in that the nitrogen content in the metal-free DLC layer is graduated.

20 Claims, 1 Drawing Sheet

(56) References Cited

U.S. PATENT DOCUMENTS

| | | | | |
|---|---|---|---|---|
| 7,273,655 | B2* | 9/2007 | Miyake et al. | 428/408 |
| 7,537,835 | B2* | 5/2009 | Mori et al. | 428/408 |
| 8,202,615 | B2* | 6/2012 | Ito et al. | 428/704 |
| 8,641,046 | B2* | 2/2014 | Hoppe et al. | 428/336 |
| 8,652,620 | B2* | 2/2014 | Fischer et al. | 428/212 |
| 8,808,858 | B2* | 8/2014 | Akari et al. | 428/408 |

FOREIGN PATENT DOCUMENTS

| | | |
|---|---|---|
| DE | 102005063123 B3 | 5/2007 |
| DE | 102008011921 A1 | 9/2009 |
| DE | 102008016864 B3 | 10/2009 |
| DE | 102009028504 B3 | 1/2011 |
| EP | 2316983 A1 | 5/2011 |
| JP | 11-130590 * | 5/1999 |
| JP | 2002032907 A | 1/2002 |
| WO | WO-2006125683 A1 | 11/2006 |
| WO | WO-2010021285 A1 | 2/2010 |

OTHER PUBLICATIONS

"Diamond-like amorphous carbon" by J. Robertson, Material Science and Engineering R 37 (2002), pp. 129-281.

* cited by examiner

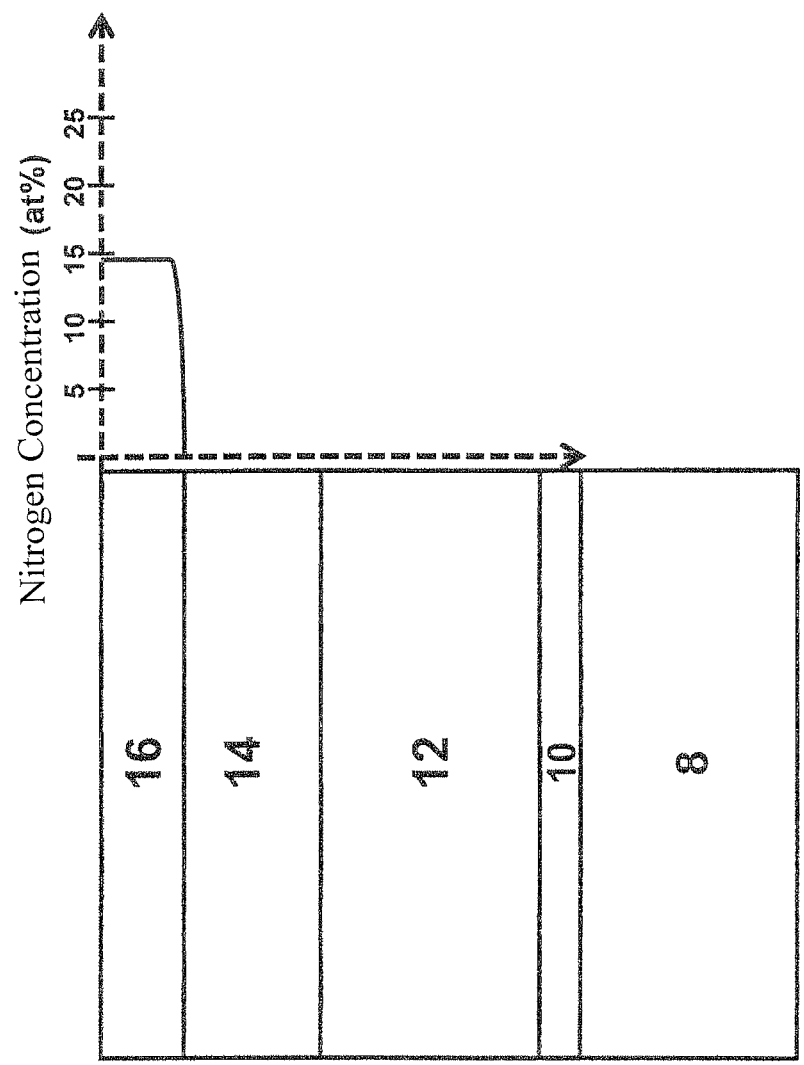

SLIDING ELEMENT, IN PARTICULAR A PISTON RING, HAVING A COATING

BACKGROUND OF THE INVENTION

1. Technical Field

The invention relates to a sliding element, in particular a piston ring, having a coating on at least one running surface.

Sliding elements such as, for example, piston rings, pistons or cylinder liners in internal combustion engines must work throughout a long service life, both with as little friction as possible and with a low level of wear. The friction that is directly linked to fuel consumption in internal combustion engines can be kept low by DLC (diamond-like carbon) coatings. Furthermore, layer thicknesses of up to 40 μm can be achieved in principle. However, with layer thicknesses of more than 5 μm, there is the problem that the layer properties change, for example in respect of the structure and the composition of the layer, and therefore the required service life is not achieved. This applies analogously to layer thicknesses of less than 5 μm.

2. Related Art

Also known in this connection are PVD coatings based on a hard material, which mostly comprise chromium nitride. Although such layers do have the necessary resistance to wear, they nevertheless do not have the required low coefficients of friction.

A sliding element having a DLC coating with good run-in behavior is known from DE 10 2005 063 123 B3, Overall, however, the durability of a low coefficient of friction can be improved further.

DE 10 2008 016 864 relates to a sliding element having a coating which comprises, from the inside outwards, an adhesive layer, a metal-containing DLC layer and a metal-free DLC layer.

Known from DE 197 35 962 A1 is a guide bush and a method of forming a hard carbon film on the inner surface of the guide bush, in which a hard carbon film of hydrogenated amorphous carbon is formed on the inner surface by a plasma CVD process.

Finally, WO 2006/125683 A1 shows a piston ring comprising, from the inside outwards, a layer comprising an element of group IVB, VB or VIB, an intermediate layer comprising a diamond-like nanocomposite composition, and a DLC layer.

Applicant's not previously published DE 10 2009 028 504 relates to a sliding element.

BRIEF DESCRIPTION OF THE INVENTION

Against this background provided is a sliding element that is improved further in respect of the combination of coefficients of friction and wear properties.

The sliding element has, on at least one surface, a coating that comprises, from the inside outwards, an adhesive layer, a DLC layer containing metal, in particular tungsten, and a metal-free DLC layer. The coating can be provided in particular on at least one running surface. As an alternative or supplement thereto, however, it is also possible to coat at least one flank. The adhesive layer is preferably a chromium adhesive layer. The metal-containing DLC layer comprises amorphous carbon and can be designated by a-C:H:Me and, as the preferred tungsten-containing DLC layer, as a-C:H:W. The outermost, or top, layer also comprises amorphous carbon and can be designated by a-C:H. Particularly good properties in respect of friction and wear were determined with the values described. These tribological properties can be influenced towards a longer service life by a thicker top layer. If this top layer becomes too thick in comparison with the middle layer, however, the wear values deteriorate since the high residual stresses of the layer reduce the adhesive strength, and this may result in delamination.

As regards the doping of the metal-free DLC layer, it could be determined in particular for the use of nitrogen that the residual stresses of the layer are advantageously reduced by this. In order to be able to ensure a long service life of the layer, the metal-free DLC layer is particularly doped with nitrogen, in particular as soon as the critical layer thickness is reached. By means hereof, residual stresses are reduced, as mentioned above, and therefore high layer thicknesses can be formed. Initial tests conducted on a wear test stand yielded good results. With regard to the details of the doping with nitrogen and the advantages that can be achieved by this, the article "Plasma-deposited a-C(N):H films" by D. F. Franceschini, Brazilian Journal of Physics, vol. 30, No. 3, Sao Paulo 2000, is made the subject matter of the application.

While the coating is formed, at least in part, on at least one running surface of the sliding element, it can extend over the entire running surface and, in particular, can also be formed, wholly or in part, on surfaces adjacent to the running surfaces, such as, for example, the flanks of a piston ring and/or at the transition from the running surface to the surfaces adjacent thereto.

Furthermore, it is presently expected that a graduated nitrogen content over the metal-free DLC layer additionally ensures a good course of residual stress.

Preferred developments of the sliding element according to the invention are described in the further claims.

Cast iron or steel is currently preferred as the base material of the sliding element, in particular of the piston ring. Particularly good properties could be determined for these materials.

In respect of the hardness of the layer, values of 1400 HV0.02 to 2900 HV0.02 are preferred for the metal-free (a-C:H, top) DLC layer, and/or of 800 to 1600 HV0.02 for the metal-containing (a-C:H:Me) DLC layer since the requirements placed on layer adhesion and cohesion were met satisfactorily with these values.

Both the metal-containing and the metal-free DLC layer can contain hydrogen, this having proved beneficial in tests.

Moreover, it is preferred that the tungsten-containing DLC layer contains nanocrystalline tungsten carbide precipitates, which is further beneficial for the properties.

For the thickness of the adhesive layer, which, in particular, is a chromium adhesive layer, a value of maximally 1 μm is preferred.

A total coating thickness of 5 μm to 40 μm, in particular approx. 10 to 20 μm, is preferred so that the described balance between the coefficient of friction and the wear properties can be achieved in a particularly satisfactory manner.

In respect of efficient realization of the coating, it is at present preferred that the adhesive layer be effected by metal vapor deposition.

Favorable manufacture of the coating according to the invention is further ensured in respect of the metal-containing and/or metal-free DLC layer if these layers are realized by means of a PVD and/or PA-CVD process. In particular, the two aforementioned processes can be combined for individual or more layers of the coating according to the invention. For the nitrogen doping, nitrogen is added during the process essentially as a gas such that in addition to carbon, which results from the ionization of acetylene in the plasma, nitrogen is precipitated and the layer is doped as described above. A detailed description of the process can be found, inter alia, in the article "Diamond-like amorphous carbon" by J. Robertson, Material Science and Engineering R 37 (2002), pages 129-281.

The ratio of the thicknesses between the metal-free DLC layer and the metal-containing DLC layer is preferably between 0.7 and 1.5 and/or the ratio of the thicknesses between the metal-free DLC layer and the coating as a whole is between 0.4 and 0.6. Particularly good wear values could be determined if the middle layer and the top layer are of almost identical thickness, and therefore a thickness ratio of approximately 1.0, in particular 0.9 to 1.1, or a thickness ratio of the top layer to the total layer of approximately 0.5, in particular 0.45 to 0.55, is preferred here. A total layer thickness of e.g. 10 to 20 μm is particularly preferred at present, with the metal-containing DLC layer accounting for approx. 40 to 70% of the total layer, and the metal-free DLC layer having a thickness of approx. 4.4 to approx. 7.6 μm.

In respect of friction, for coatings within said ranges it was possible to determine coefficients of friction that satisfactorily meet the demands arising in an internal combustion engine and that, in particular, are largely constant. Outside these ranges, by contrast, high friction coefficient peaks and a non-constant friction characteristic were determined even after a short period of time.

As an explanation for this behavior, to which, however, the invention is not restricted, it is at present considered that the metal-free DLC layer first introduces into the overall system, i.e. into the coating as a whole, very high residual stresses that, in the case of a layer thickness of the metal-containing DLC layer which is similar to the thickness of the outermost layer, can be compensated in such a way that the coating is realized in an optimal manner with regard to the combination between strength and toughness. A sliding element coated therewith, in particular a piston ring, thus has a good resistance to wear. If the layer thickness ratio between the metal-free and the metal-containing DLC layer is <0.7, and/or if the layer thickness ratio of the top layer to the total layer is <0.4, the service life of the sliding element is too short since the outermost, metal-free DLC layer does have a high resistance to wear, but has nevertheless an insufficient layer thickness. In contrast to this, if the layer thickness ratio between the metal-free and the metal-containing DLC layer is >1.5, and/or if the layer thickness ratio between the top layer and the total layer is >0.6, the thickness of the metal-containing DLC layer is not sufficient to compensate the residual stresses. This results in premature wear of the DLC layer as a whole, despite the great thickness of the outermost layer, or in flaking-off of the DLC layer as a result of excessively high loads during operation. If the layer thickness of the metal-free a-C:H layer is to be further increased, this is possible by means of nitrogen doping since the residual stresses are reduced by this and the coating process is more stable owing to the improved conductivity of the top layer. The reduction of the residual stresses moreover leads to an improved friction behavior.

Furthermore, a nitrogen content of more than 5 at % and/or at the most 40 at % has proven successful in initial tests. In particular, 10 at % to 25 at % are preferred at present.

Preferably doped with nitrogen is an outer region of the metal-free DLC layer.

In respect of the thickness portion accounted for by the doped region in the metal-free DLC layer, a thickness of 10 to 90% of the non-doped region is preferred. Initial tests yielded good results for these values.

BRIEF DESCRIPTION OF THE DRAWING

Preferred embodiment examples of the invention are explained more fully in the following with reference to the drawing.

The sole FIGURE shows, schematically, the structure of the coating according to the invention.

DETAILED DESCRIPTION OF PREFERRED EMBODIMENTS OF THE INVENTION

As represented schematically in the FIGURE, the coating according to the invention comprises on a substrate 8, from the inside outwards, an adhesive layer 10, a metal-containing DLC layer 12, and a top layer 14, 16 which is a metal-free DLC layer. In the embodiment example shown, an outer region 16 is doped with nitrogen, while an inner region 14 is not doped with nitrogen. In the example shown, the nitrogen concentration in the doped region is approx. 15% and is only slightly graduated at the transition from the doped to the non-doped region. In other words, the nitrogen content drops to 0 over a relatively small thickness range. This progress can, however, just as well be graduated.

Examples

The properties of the coating according to the invention were checked as follows. Tests were carried out with 2 piston rings, with the top layer of the coating of the running surface being doped in one case and not being doped in a further embodiment.

For the doped variant, a coefficient of friction lower by approx. 20% was measured. This can be explained by the fact that the content of sp2-hybridized carbon atoms increases by nitrogen doping. The sp2-hybridized carbon atoms have a graphite-like crystalline structure, which makes it possible that the individual crystal planes can slide in one spatial direction in the case of shear stresses, which means that the mechanical energy can be absorbed by a shift of the crystal planes. This results in less friction than with layer systems having a lower sp2 content. It must be noted that the sp2 content should not be set too high since the resistance to wear is reduced by this.

The invention claimed is:

1. A sliding element having on at least one surface thereof a coating comprising, from the inside outwards, an adhesive layer, a DLC layer containing metal, and a metal-free DLC layer which is doped with nitrogen at least in some regions, and wherein the nitrogen content in the metal-free DLC layer is graduated.

2. The sliding element according to claim 1, wherein the sliding element comprises a substrate of cast iron or steel.

3. The sliding element according to claim 1, wherein the metal-free DLC layer has a hardness of 1400 HV0.02 to 2900 HV0.02.

4. The sliding element according to claim 1, wherein at least one of the metal-containing and metal-free DLC layers contains hydrogen.

5. The sliding element according to claim 1, wherein the adhesive layer comprises a chromium adhesive layer which has a thickness of no more than 1 μm.

6. The sliding element according to claim 1, wherein the total coating thickness is from 5 μm to 40 μm.

7. The sliding element according to claim 1, wherein the adhesive layer is effected by metal vapor deposition.

8. The sliding element according to claim 1, wherein at least one of the metal-containing and metal-free DLC layers is realized by means of a PVD and/or PA-CVD process.

9. The sliding element according to claim 1, wherein the thickness of the metal-free DLC layer in relation to the thickness of the metal-containing DLC layer has a ratio of 0.7 to 1.5.

10. The sliding element according to claim 1, wherein the metal-free DLC layer has a nitrogen content of more than 5 at %.

11. The sliding element according to claim 1, wherein an outer region of the metal-free DLC layer is doped.

12. The sliding element according to claim 1, wherein the thickness of the doped region of the metal-free DLC layer is 10 to 90% of the thickness of the non-doped region of the metal-free DLC layer.

13. The sliding element of claim 1, wherein the sliding element comprises a piston ring.

14. The sliding element of claim 1, wherein the metal-containing DLC layer contains tungsten.

15. The sliding element according to claim 14, wherein the tungsten-containing DLC layer contains nanocrystalline tungsten carbide precipitates.

16. The sliding element of claim 1, wherein the metal-containing DLC layer has a hardness of 800-1600 HV0.02.

17. The sliding element of claim 14, wherein the metal-containing DLC layer has a hardness of 800-1600 HV0.02.

18. The sliding element according to claim 1, wherein the thickness of the metal-free DLC layer in relation to the total coating thickness has a ratio of 0.4 to 0.6.

19. The sliding element of claim 10, wherein the metal-free DLC layer has nitrogen content of 40 at % or less.

20. The sliding element of claim 19, wherein the nitrogen content is between 10-25 at %.

\* \* \* \* \*